(12) United States Patent
Yamashita et al.

(10) Patent No.: US 6,223,318 B1
(45) Date of Patent: *Apr. 24, 2001

(54) IC TESTER HAVING REGION IN WHICH VARIOUS TEST CONDITIONS ARE STORED

(75) Inventors: Eisaku Yamashita; Ryuji Oomura; Yasuyuki Ochi, all of Hyogo (JP)

(73) Assignees: Mitsubishi Denki Kabushiki Kaisha, Tokyo; Ryoden Semiconductor System Engineering Corporation, Hyogo, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,900

(22) Filed: Jun. 8, 1998

(30) Foreign Application Priority Data

Jan. 14, 1998 (JP) .................................................. 10-005531

(51) Int. Cl.[7] .............................. G01R 31/28; G06F 11/00
(52) U.S. Cl. ............................................ 714/744; 714/738
(58) Field of Search .................................... 714/738, 736, 714/743, 744; 324/158.1; 395/500.07

(56) References Cited

U.S. PATENT DOCUMENTS

| 4,497,056 | * | 1/1985 | Sugamori ............................ 714/733 |
| 4,606,025 | * | 8/1986 | Peters et al. ......................... 714/718 |
| 5,286,656 | * | 2/1994 | Keown et al. ............................ 437/7 |
| 5,465,383 | * | 11/1995 | Shimono et al. ................ 714/738 X |
| 5,608,495 | * | 3/1997 | Kitakubo et al. ...................... 399/72 |

FOREIGN PATENT DOCUMENTS

| 0432292 | * | 6/1991 | (EP) . |
| 7-260888 | | 10/1995 | (JP) . |
| 8-94716 | | 4/1996 | (JP) . |

* cited by examiner

Primary Examiner—Emmanuel L. Moise
(74) Attorney, Agent, or Firm—McDermott, Will & Emery

(57) ABSTRACT

An IC tester includes a test pattern storage circuit that stores a test pattern, a delay amount storage table that stores a test condition, an offset address generation circuit that divides the delay amount storage table into a plurality of regions and selects a region from the plurality of divided regions, a reference signal delay circuit that delays a reference signal according to a test condition stored in a region of the delay amount storage table selected by the offset address generation circuit, and a test waveform formation circuit that generates a test waveform according to the test pattern stored in the test pattern storage circuit and the reference signal delayed by the reference signal delay circuit.

12 Claims, 6 Drawing Sheets

| TEST CONDITION NUMBER | TEST ITEM NUMBER | USAGE FREQUENCY | TEST CONDITION |
|---|---|---|---|
| | | | CPU STORAGE CIRCUIT |
| 1 | 1, . . | 5 | 1 / 2 / 3 / 4 |
| 2 | 2, . . | 10 | 1 / 2 / 3 / 4 |
| 3 | 3, 5. | 23 | 1 / 2 / 3 / 4 |
| 4 | 4, . . | 2 | 1 / 2 / 3 / 4 |
| 5 | 6, . . | 25 | 1 / 2 / 3 / 4 |
| M | . . , N | 15 | 1 / 2 / 3 / 4 |

IC TESTER HAVING REGION IN WHICH VARIOUS TEST CONDITIONS ARE STORED

BACKGROUND OF THE INVENTION

1. Field of the Invention

The present invention relates to IC testers for testing the electrical characteristics of an IC (Integrated Circuit), and more particularly to an IC tester that can set a plurality of test conditions.

2. Description of the Background Art

In accordance with increase in the integration density and incorporation of multifunctions in an IC, the circuit complexity and the number of input and output terminals have been increased. The time required for testing the electrical characteristics of such an IC is getting longer since measurement covering a great number of items must be taken. In general, an IC tester is widely used for testing an IC. The performance of the IC tester will greatly contribute to reduce the time required for testing.

FIG. 1 is a block diagram showing a schematic structure of a conventional IC tester. The IC tester includes an CPU (Central Processing Unit) 1 for providing the overall control of the IC tester, a reference signal generation circuit 2 for generating a reference signal used in forming a test waveform, a control circuit 3 for controlling each circuit in testing an IC 12 of interest, a reference signal delay circuit 4 for delaying the reference signal generated by reference signal generation circuit 2, a test pattern storage circuit 5 for storing a test pattern of under-testing IC 12, a delay amount storage circuit for storing the amount of delay by reference signal delay circuit 4, a test waveform formation circuit 7 for forming a test waveform according to signals output from reference signal delay circuit 4 and test pattern storage circuit 5, a voltage amplify circuit 8 for amplifying the voltage of the signal output from test waveform formation circuit 7, a voltage supply circuit 9 for supplying a voltage to voltage amplify circuit 8, a D/A (digital/analog) conversion data storage circuit 10 for holding input data and providing the data to voltage supply circuit 9, and a control signal transmission bus 13 that is used by CPU 1 in providing data to respective circuits. In testing IC 12, control circuit 13 provides an address 14 to test pattern storage circuit 5 and delay amount storage circuit 6.

FIG. 1 depicts the schematic structure of one channel for the IC tester. The IC tester includes a plurality of the circuitry shown in FIG. 1. In testing IC 12, CPU 1 sets the data for test pattern storage circuit 5, delay amount storage circuit 6 and D/A conversion data storage circuit 10 for each channel.

The process of forming a test waveform input to under-testing IC 12 will be described hereinafter. CPU 1 includes an internal memory for storing a test program according to the test specification of under-testing IC 12 and test conditions. CPU 1 executes the test program to generate a test waveform according to a plurality of test items. The generated test waveform is provided to under-testing IC 12. For example, CPU 1 has all the test patterns required for testing prestored in test pattern storage circuit 5 when testing is to be carried out. In executing the first test item, CPU 1 has the amount of delay corresponding to the time from the transition of the reference signal until the transition of the test waveform stored for each test pattern in delay amount storage circuit 6. The voltage value of that output waveform is stored in D/A conversion data storage circuit 10. Then, the test is initiated. In general, CPU 1 has the data for executing the next test item stored in delay amount storage circuit 6 and D/A conversion data storage circuit 10 after the test of the previous test item is completed.

Reference signal generation circuit 2 generates a reference signal for testing IC 12. The cycle of a reference signal corresponds to the cycle of the test waveform generated by test waveform formation circuit 7.

Test pattern storage circuit 5 holds the test pattern of the test item stored by CPU 1. When IC 12 is tested, a test pattern is sequentially provided to test waveform formation circuit 7 in synchronization with the change of address signal 14 applied from control circuit 3.

Delay amount storage circuit 6 holds the amount of delay stored by CPU 1. When IC 12 is tested, the amount of delay is provided to reference signal delay circuit 4 in synchronization with the change in address signal 14 output from control circuit 3. The details of delay amount storage circuit 6 will be described afterwards. Reference signal delay circuit 4 delays the reference signal output from reference signal generation circuit 2 in a programmable manner according to the amount of delay from delay amount storage circuit 6. The delayed signal is provided to test waveform formation circuit 7.

Test waveform formation circuit 7 holds the test pattern output from test pattern storage circuit 5 in synchronization with the delayed reference signal output from reference signal delay circuit 4. The output of test waveform formation circuit 7 is provided to voltage amplify circuit 8.

D/A conversion data storage circuit 10 holds and provides to voltage supply circuit 9 the digital data stored by CPU 1. Voltage supply circuit 9 converts the digital data into an analog voltage value, which is provided to voltage amplify circuit 8. Voltage amplify circuit 8 amplifies the voltage of the test waveform output from test waveform formation circuit 7 according to the analog voltage value from voltage supply circuit 9. The amplified voltage is provided to under-testing IC 12.

When the IC tester is executing one test item, CPU 1 issues a control signal via transmission bus 13 to store data into test pattern storage circuit 5, delay amount storage circuit 6, and D/A conversion data storage circuit 10. Then, CPU 1 sends to control circuit 3 an instruction to initiate testing of IC 12. Control circuit 3 responds to this instruction from CPU 1 to increment address signal 14 provided to test pattern storage circuit 5 and delay amount storage circuit 6 in synchronization with a reference signal output from reference signal generation circuit 2. Test pattern storage circuit 5 and delay amount storage circuit 6 sequentially provide the test pattern and delay amount corresponding to address signal 14, respectively. Test waveform formation circuit 7 produces a test waveform according to the delayed reference signal from reference signal delay circuit 4 and the test pattern from test pattern storage circuit 5. The test waveform is provided to voltage amplify circuit 8. Here, delay amount storage circuit 6 and D/A conversion data storage circuit 10 are referred to as "test condition storage circuit", and test waveform formation circuit 7 and voltage amplify circuit 8 are referred to as "waveform formation circuit".

By sequentially carrying out the above process for each test item, the testing operation on IC 12 is carried out. In general, D/A conversion data storage circuit 10 continuously outputs the data set by CPU 1 prior to the test until the entire test is completed.

FIG. 2 is a block diagram showing a specific structure of delay amount storage circuit 6 of FIG. 1. Delay amount storage circuit 6 includes a pointer storage circuit 20 storing the pointer used in selecting an amount of delay, and a delay amount storage table 21 for storing the amount of data that is provided to reference signal delay circuit 4 and three-state buffers 22 and 23.

Delay amount storage circuit 6 is taken as an example to be described hereinafter of the storage circuits such as delay amount storage circuit 6 and D/A conversion data storage circuit 10 that has data updated rather frequently.

A plurality of delay amount data that will be used by reference signal delay circuit 4 are stored in delay amount storage table 21 by CPU 1. The pointer of the delay amount data stored in delay amount storage table 21 is stored in pointer storage circuit 20 by CPU 1. Pointer storage circuit 20 has a capacity that can store data identical to the number of test patterns stored in test pattern storage circuit 5. Data corresponding to address signal 14 output from control circuit 3 is provided to delay amount storage table 21 as the pointer.

In storing data into pointer storage circuit 20, CPU 1 renders the output of three-state buffer 22 to a high impedance state. Three-state buffer 23 is turned on. In response, the data from CPU 1 is provided to pointer storage circuit 20. CPU 1 stores data into pointer storage circuit 20 by sequentially changing the address of pointer storage circuit 20 via control circuit 3.

In storing data into delay amount storage table 21, CPU 1 renders three-state buffer 23 to a high impedance state. Three-state buffer 22 is turned on. In response, the address from control circuit 3 is provided to delay amount storage table 21. CPU 1 sequentially stores data by applying the address to delay amount storage table 21 via control circuit 3.

In testing IC 12, the pointer corresponding to address signal 14 output from control circuit 3 is provided from pointer storage circuit 20. The amount of delay selected by that pointer in delay amount storage table 21 is provided to reference signal delay circuit 4. Delay amount storage table 21 accommodates a plurality of types of ICs such as an IC 1 that requires four delay amount data and an IC 2 that requires N delay amount data as shown in FIG. 2 since the number of the delay amount to be set depends upon the type of the IC to be tested.

FIGS. 3A–3D are diagrams for describing the procedure of forming a waveform in a conventional IC tester. According to the delay amount output from delay amount storage circuit 6 shown in FIG. 3A, reference signal delay circuit 4 delays the reference signal of FIG. 3B to the signal shown in FIG. 3C. Test waveform formation circuit 7 holds the test pattern output from test pattern storage circuit 5 with the delayed reference signal, which is output as a test waveform shown in FIG. 3D.

The IC tester must carry out a test item corresponding to various test conditions for the purpose of testing the electrical properties of an IC of interest. These test conditions are reset for each test item. The time required for resetting the test conditions is great for an IC that has a complex function. In practice, an IC tester has a plurality of the circuitry shown in FIG. 1 corresponding to one channel. Since it is necessary to reset the test conditions for each circuitry, the amount of data for the reset operation is great. There was a problem that the time required for resetting the test conditions occupied a major portion of the IC testing time.

SUMMARY OF THE INVENTION

An object of the present invention is to provide an IC tester that can have testing time reduced.

According to an aspect of the present invention, an IC tester includes a test pattern storage circuit that stores a test pattern, a test condition storage circuit that stores a test condition, a select circuit that divides the test condition storage circuit into a plurality of regions and selects a region out from the plurality of divided regions, and a waveform formation circuit that forms a waveform that is applied to an IC to be tested from a reference signal and a test pattern stored in the test pattern storage circuit according to the test condition stored in the region selected by the select circuit in the test condition storage circuit.

A plurality of types of test conditions can be stored in the test condition storage circuit since the select circuit selects a region out of the plurality of divided regions in the test condition storage circuit. Since it is not necessary to set the test condition again into the test condition storage circuit, the time required for testing can be reduced significantly.

According to another aspect of the present invention, an IC tester includes a test pattern storage circuit that stores a test pattern, a test condition storage circuit that stores a test condition, a select circuit that divides the test condition storage circuit into a plurality of regions and selects a region out from the plurality of divided regions, a delay circuit that delays a reference signal according to the test condition stored in the region in the test condition storage circuit selected by the select circuit, and a test waveform formation circuit that generates a test waveform according to the test pattern stored in the test pattern storage circuit and the reference signal delayed by the delay circuit.

A plurality of types of test conditions can be stored in the test condition storage circuit since the select circuit selects a region from the plurality of divided regions of the test condition storage circuit. Therefore, the time required for setting a test condition again can be reduced significantly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
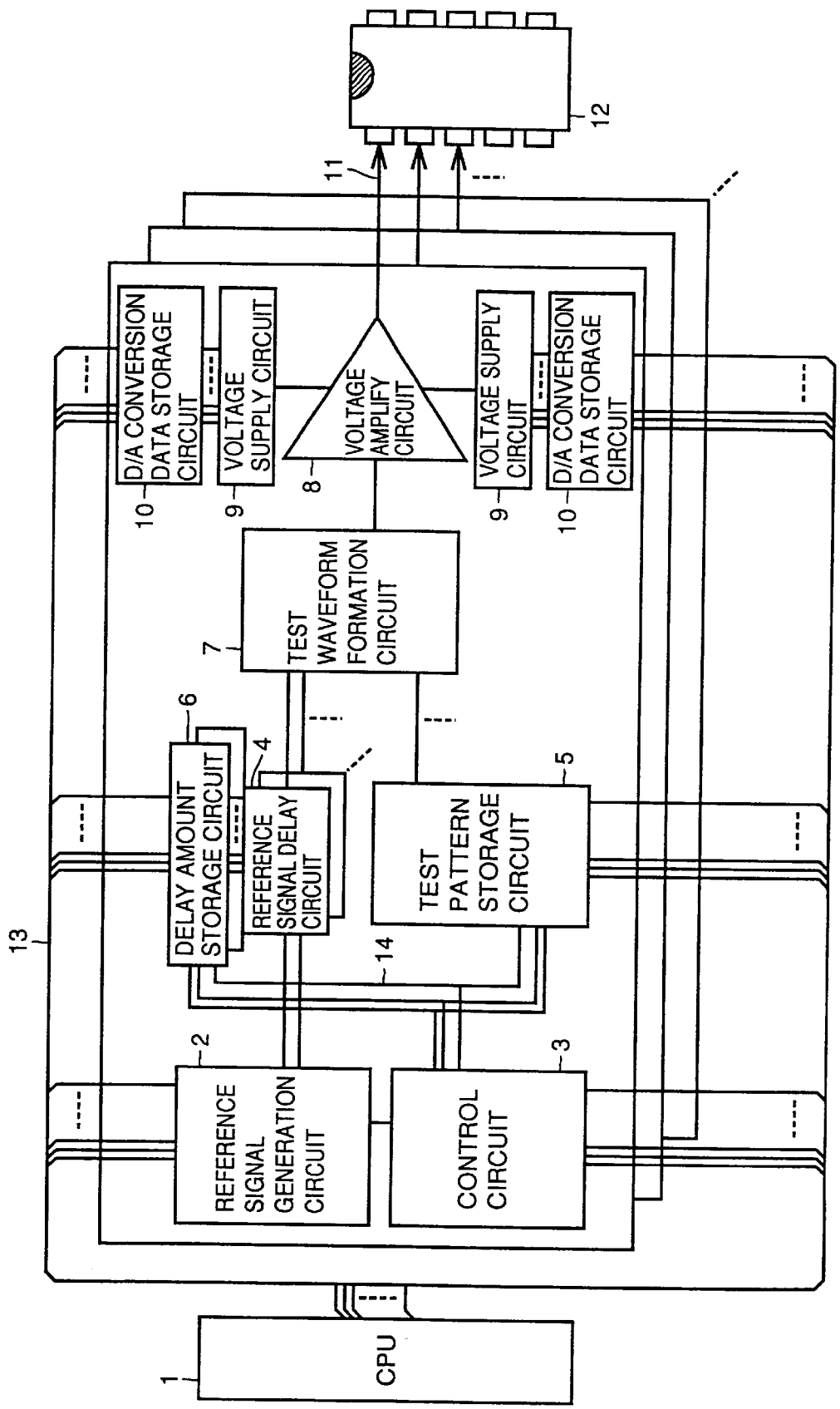
FIG. 1 is a block diagram showing a schematic structure of a conventional IC tester.
Figure 2:
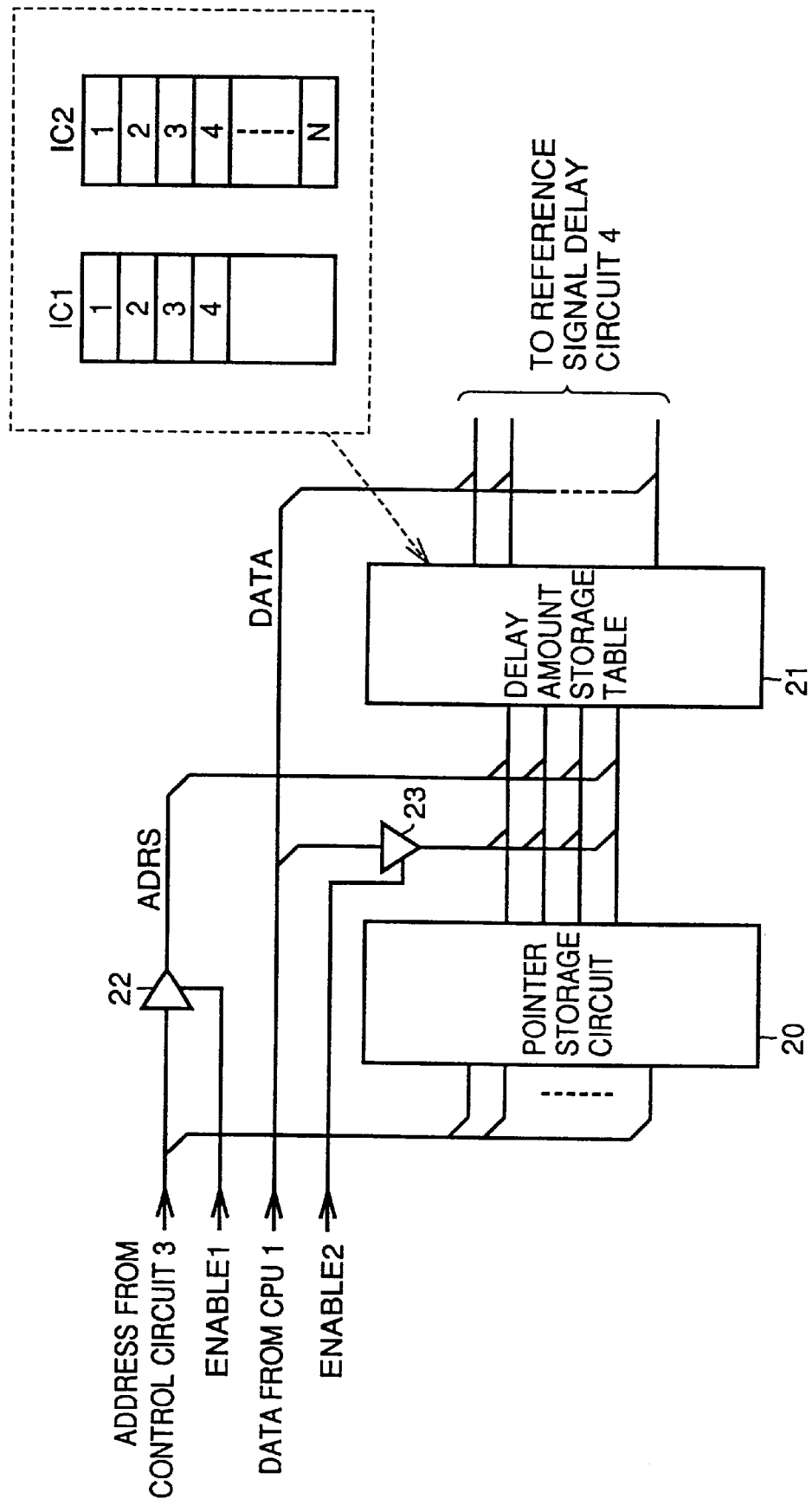
FIG. 2 is a block diagram showing a schematic structure of a delay amount storage circuit 6 of a conventional IC tester.
Figure 3:
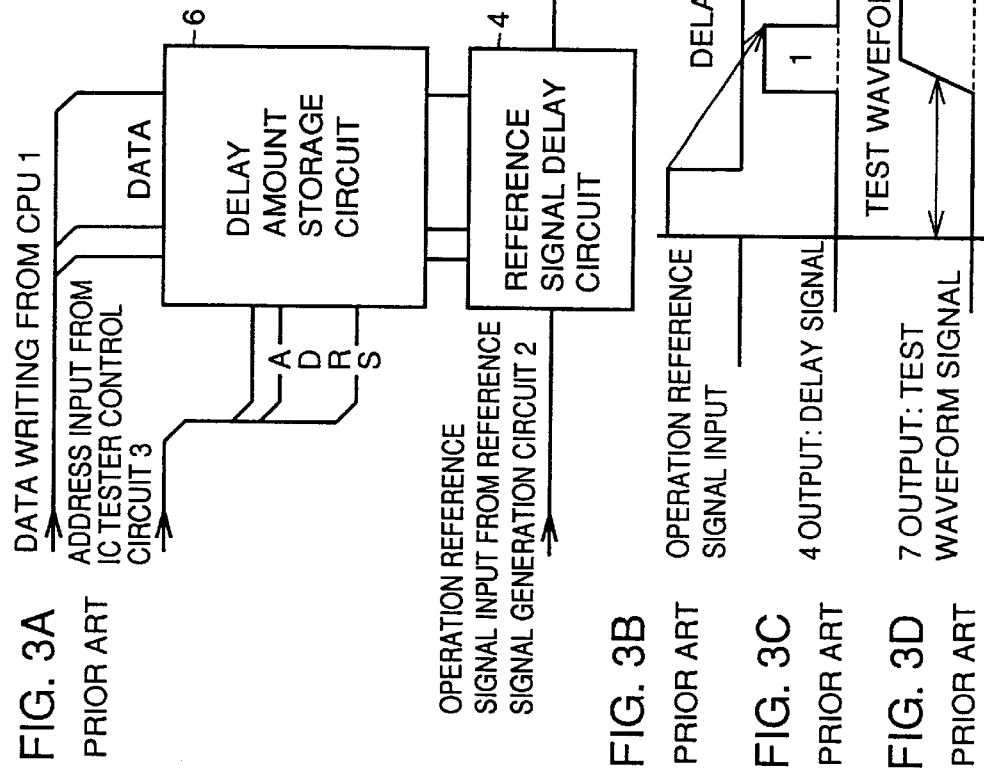
FIGS. 3A–3D are diagrams showing the procedure of producing a test waveform in a conventional IC tester.
Figure 4:
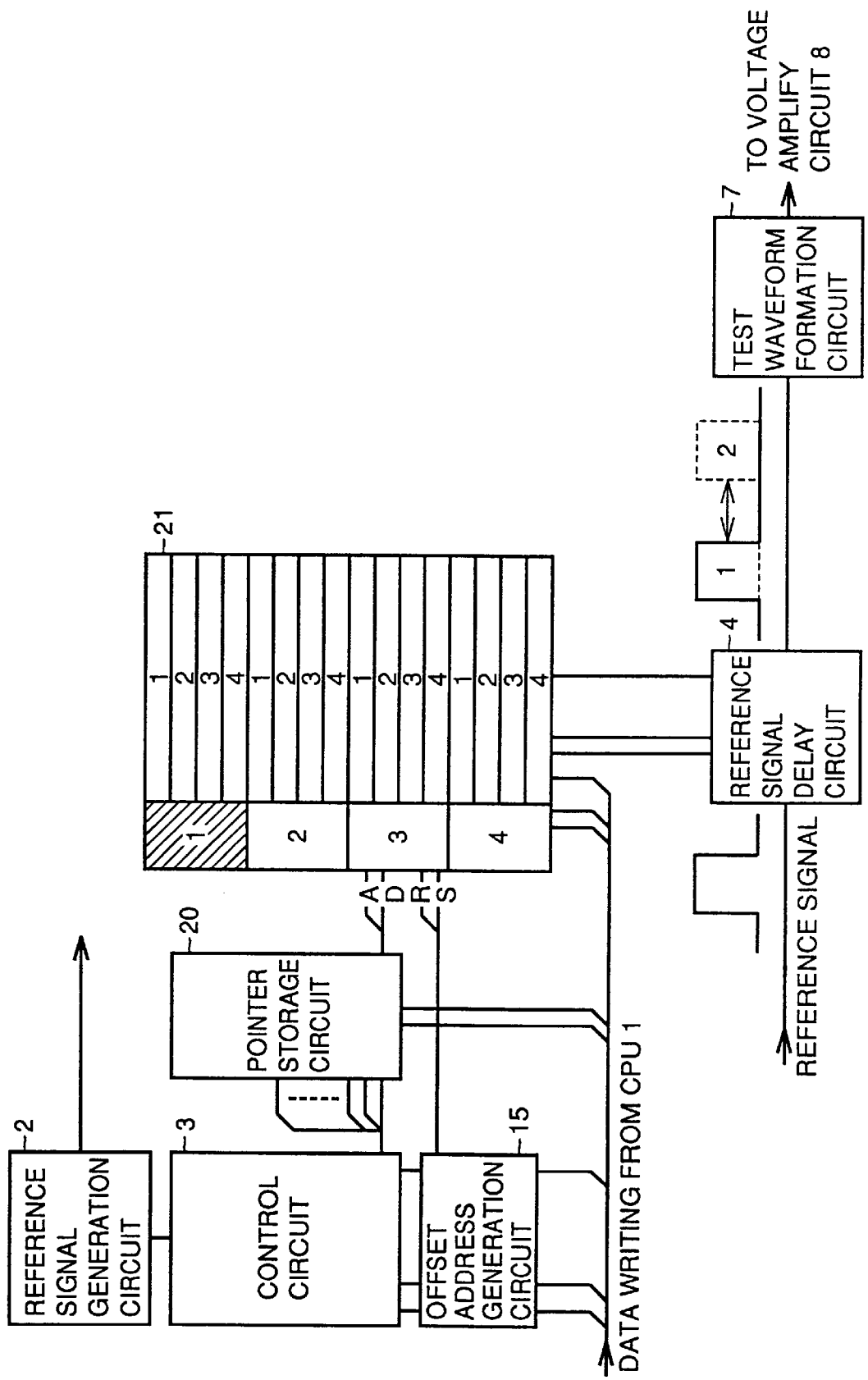
FIG. 4 is a block diagram showing a schematic structure of an IC tester according to a first embodiment of the present invention.

An IC tester according to a first embodiment of the present invention is shown in FIG. 4. The IC tester of the present embodiment differs in structure from the conventional IC tester shown in FIGS. 1 and 2 in that an offset address generation circuit (select circuit) 15 is added. Offset address generation circuit 15 is under control of CPU 1 to generate an offset address (higher order address) to delay amount storage table 21. Components having a similar structure and function will not be described again. It is assumed that the connection of CPU 1, voltage amplify circuit 8, voltage supply circuit 9, and D/A conversion data storage circuit 10 of the present invention not shown in FIG. 4 is similar to that shown in FIG. 1.

Offset address generation circuit 15 provides the higher order address of delay amount storage table 21 under control of CPU 1. Assuming that 16 values of the delay amount can be stored in delay amount storage table 21, offset address generation circuit 15 provides the more significant 2 bits of address of delay amount storage table 21 in order to divide delay amount storage table 21 into four. Pointer storage circuit 20 stores the information of the less significant 2 bits of address of delay amount storage table 21.

Assuming that there are four types of test conditions for each test item of under-testing IC 12, the test conditions for four test items can be prestored in delay amount storage table 21. Therefore, the testing of four items can be carried out continuously without having to reset the test conditions by having CPU 1 control offset address generation circuit 15 for each test item to switch the offset address of delay amount storage table 21. In the present embodiment, 16 values of the delay amount can be set in delay amount storage table 21. However, by increasing the memory capacity of delay amount storage table 21 and by increasing the number of offset addresses output from offset address generation circuit 15, testing of higher efficiency can be carried out.

In the IC tester of the present embodiment, the time required for testing an IC can be reduced by virtue of fewer times for resetting the test conditions.

Second Embodiment

Figures 5A, 5B:
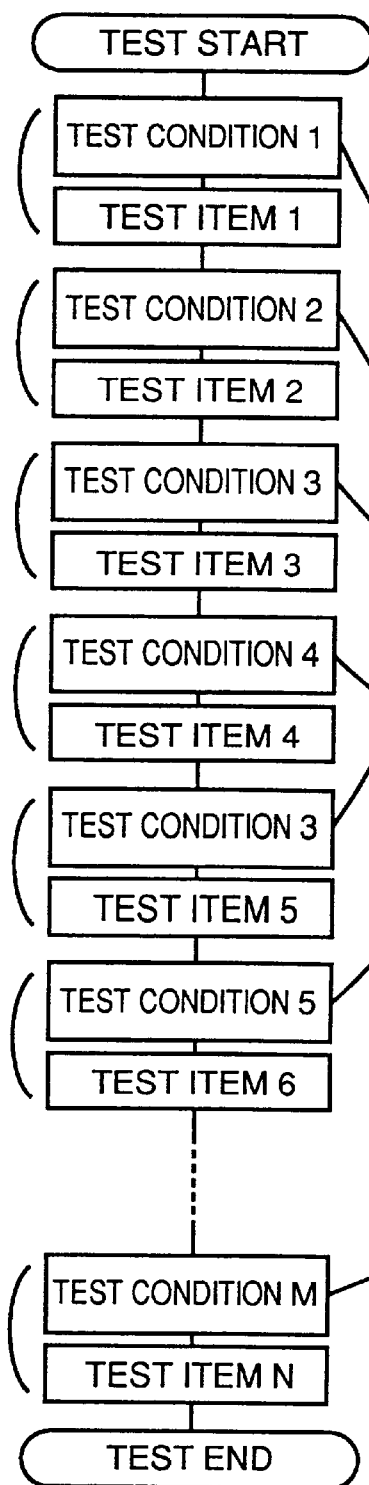
FIGS. 5A and 5B show the relationship between the test item executed by the test program and the frequency of usage of a test condition.

The relationship between the test program and the usage frequency of the test condition carried out by an IC tester according to a second embodiment of the present invention will be described hereinafter with reference to FIGS. 5A and 5B. IC 12 is tested according to the test program held in the memory in CPU 1 by sequentially executing test items 1 to N shown in FIG. 5A. Respective test conditions are set for each test item. Therefore, the frequency of usage can be obtained by comparing each of the test conditions determined for test items 1–N and counting the matching test conditions. As shown in FIG. 5A, test item number 3 and test item number 5 respectively use test condition number 3. Therefore, "3" and "5" are stored in the test item number column for test condition number 3 in FIG. 5B. The current frequency of usage is indicated as "23".

Figure 6:
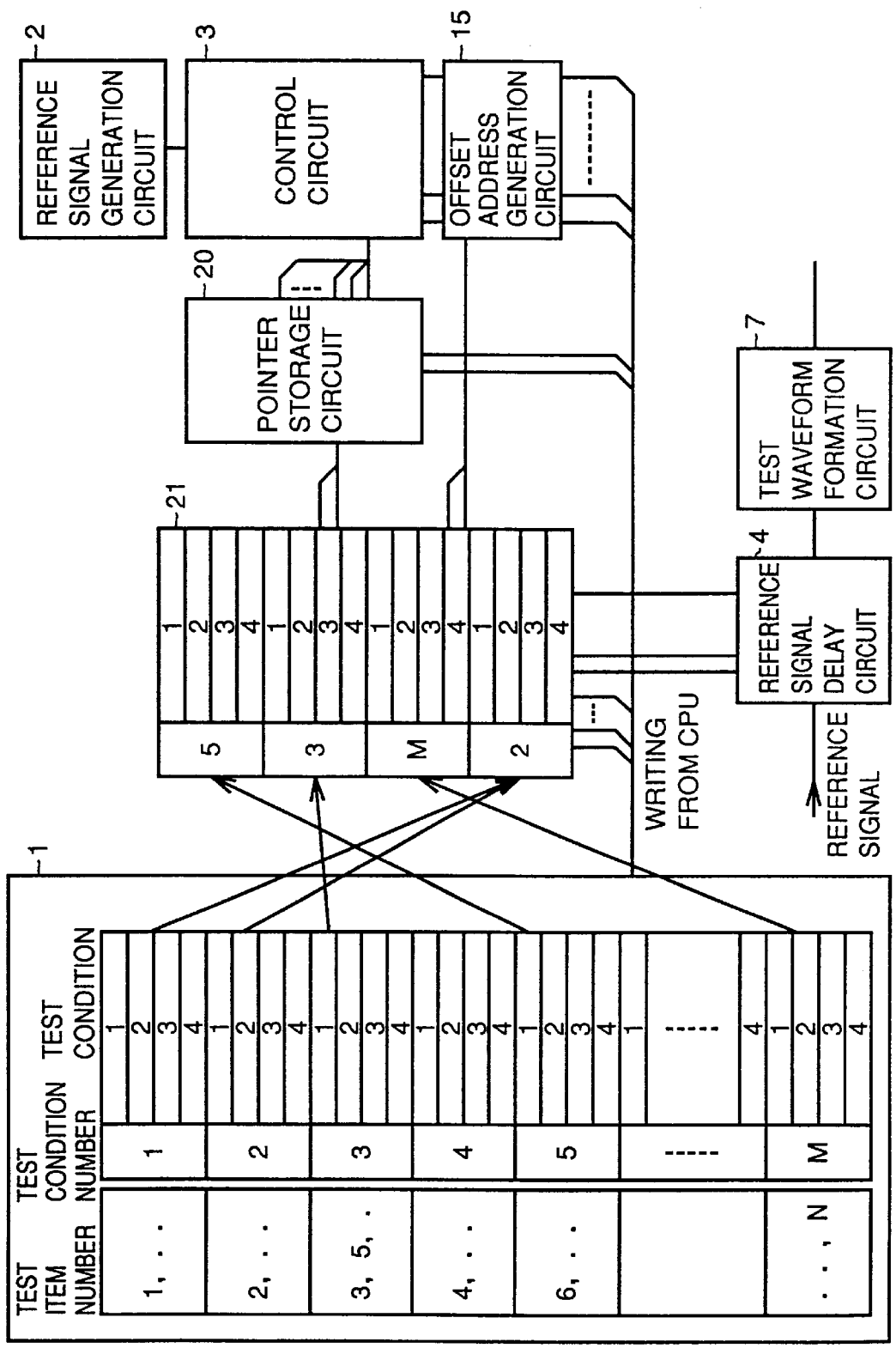
FIG. 6 is a block diagram showing a schematic structure of an IC tester according to a second embodiment of the present invention.

The IC tester of the second embodiment shown in FIG. 6 differs from the IC tester of the first embodiment shown in FIG. 4 only in that the test condition to be stored into delay amount storage table 21 is determined according to the frequency of usage of the test condition by CPU 1. Description of the components having a similar structure and function will not be repeated.

In the IC tester of the previous first embodiment, CPU 1 had to reset the test conditions in delay amount storage table 21 during execution of a test program to continue the test when the total number of test conditions for under-testing IC 12 is greater than those that can be stored in delay amount storage table 21. In other words, when the test condition previously set is required again, the test condition does not have to be reset if it remains in delay amount storage table 21. However, if the relevant test condition is deleted when the test condition is to be used again, the same test condition had to be set once more. Therefore, the test program becomes more complex. There was a problem that development of the test program is not easy although a plurality of test conditions can be stored in delay amount storage table 21.

The IC tester of the second embodiment is directed to this problem. Prior to execution of the test program, CPU 1 stores test conditions into delay amount storage table 21 starting from the test condition having the highest frequency of usage. In sequentially executing test items 1–N according to the test program, a test condition that is not stored in delay amount storage table 21, when encountered, will be stored in the region in delay amount storage table 21 where the test condition having the lowest frequency of usage in the test conditions was stored. For example, when "5", "3", "M" and "2" are stored in delay amount storage table 21 as shown in FIG. 6, test item 1 is executed as set forth in the following. Since test condition 1 is not yet stored, test item 1 cannot be initially executed. Therefore, test condition 1 is set into the region where test item 2 having the lowest frequency of usage is stored. Then, test item 1 is carried out. Similarly, when test item 2 is to be executed by CPU 1, test condition 2 will be set into the region where test condition 1 is stored out of the test conditions stored in delay amount storage table 21. By sequentially repeating this process, the test conditions of higher frequency of usage will always be stored in delay amount storage table 21.

In the second embodiment, the frequency of usage of the test conditions is calculated, and the test conditions are stored in delay amount storage table 21 according to the frequency of usage. Therefore, the sequence of the test items and the procedure for resetting the test condition do not have to be confirmed. As a result, the time required for testing can be further reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An IC tester comprising:
    a test pattern storage circuit that stores a test pattern;
    a test condition storage circuit that stores a test condition;
    a select circuit that divides said test condition storage circuit into a plurality of regions and selects a region out from said plurality of divided regions; and
    a waveform formation circuit that generates a waveform to be applied to an IC to be tested from a reference signal and the test pattern stored in said test pattern storage circuit according to a test condition stored in the region in said test condition storage circuit selected by said select circuit.

2. The IC tester according to claim 1, wherein said select circuit divides said test condition storage circuit into a plurality of regions and selects a region from said plurality of divided regions by providing an offset address to said test condition storage circuit.

3. An IC tester comprising:
    a test pattern storage circuit that stores a test pattern;
    a test condition storage circuit that stores a test condition;
    a select circuit that divides said test condition storage circuit into a plurality of regions and selects a region out from said plurality of divided regions;

a waveform formation circuit that generates a waveform to be applied to an IC to be tested from a reference signal and the test pattern stored in said test pattern storage circuit according to a test condition stored in the region in said test condition storage circuit selected by said select circuit;

usage frequency calculation means for calculating a frequency of usage of the test condition; and control means for providing control of storage of the test condition into the plurality of regions of said test condition storage circuit divided by said select circuit according to the frequency of usage calculated by said usage frequency calculation means.

4. The IC tester according to claim 3, wherein said control means stores a new test condition into a region of said test condition storage circuit divided by said select circuit, said region being the region where a test condition of the lowest frequency of usage calculated by said usage frequency calculation means is stored out of the test conditions stored in the regions of said test condition storage circuit.

5. The IC tester according to claim 3, wherein said usage frequency calculation means refers to a test condition set for each test item to calculate a frequency of usage by detecting same test conditions.

6. An IC tester comprising:

a test pattern storage circuit that stores a test pattern;

a test condition storage circuit that stores a test condition;

a select circuit that divides said test condition storage circuit into a plurality of regions and selects a region out from said plurality of divided regions;

a delay circuit that delays a reference signal according to a test condition stored in the region of said test condition storage circuit selected by said select circuit; and a test waveform formation circuit that generates a test waveform according to the test pattern stored in said test pattern storage circuit and the reference signal delayed by said delay circuit.

7. A method of testing an integrated circuit, comprising the steps of:

storing a test pattern in a test pattern storage circuit;

storing a test condition in a test condition storage circuit that includes a plurality of storing regions;

selecting a region out from said plurality of storing regions; and generating a waveform to be applied to an integrated circuit to be tested from a reference signal and the test pattern stored in said test pattern storage circuit according to a test condition stored in the selected region in said test condition storage circuit.

8. The method according to claim 7, wherein said step of selecting a region out from said plurality of storing regions includes the step of selecting a region from said plurality of storing regions by providing an offset address to said test condition storage circuit.

9. A method of testing an integrated circuit, comprising the steps of:

storing a test pattern in a test pattern storage circuit;

storing a test condition in a test condition storage circuit that includes a plurality of storing regions;

selecting a region out from said plurality of storing regions;

generating a waveform to be applied to an integrated circuit to be tested from a reference signal and the test pattern stored in said test pattern storage circuit according to a test condition stored in the selected region in said test condition storage circuit;

calculating a frequency of usage of the test condition; and controlling storage of the test condition in the plurality of storing regions of said test condition storage circuit according to the calculated frequency of usage.

10. The method according to claim 9, wherein said step of controlling storage of the test condition in the plurality of storing regions of said test condition storage circuit includes the step of storing a new test condition in a region of said test condition storage circuit, said region being the region where a test condition of the lowest frequency of usage is stored out of the test conditions stored in the regions of said test condition storage circuit.

11. The method according to claim 9, wherein said step of calculating a frequency of usage of the test condition includes the step of referring to a test condition set for each test item to calculate a frequency of usage by detecting same test conditions.

12. A method of testing an integrated circuit, comprising the steps of:

storing a test pattern in a test pattern storage circuit;

storing a test condition in a test condition storage circuit that includes a plurality of storing regions;

selecting a region out from said plurality of storing regions;

delaying a reference signal according to a test condition stored in the selected region of said test condition storage circuit; and generating a test waveform according to the test pattern stored in said test pattern storage circuit, and the delayed reference signal.

* * * * *